(12) United States Patent
Clinton et al.

(10) Patent No.: US 8,199,565 B2
(45) Date of Patent: *Jun. 12, 2012

(54) MAGNETIC RANDOM ACCESS MEMORY WITH DUAL SPIN TORQUE REFERENCE LAYERS

(75) Inventors: Thomas W. Clinton, Pittsburgh, PA (US); Michael A. Seigler, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/210,448

(22) Filed: Aug. 16, 2011

(65) Prior Publication Data

US 2011/0298069 A1 Dec. 8, 2011

Related U.S. Application Data

(63) Continuation of application No. 12/949,871, filed on Nov. 19, 2010, now Pat. No. 8,023,317, which is a continuation of application No. 12/327,184, filed on Dec. 3, 2008, now Pat. No. 7,859,892.

(51) Int. Cl.
*G11C 11/00* (2006.01)
(52) U.S. Cl. ........................ 365/158; 365/173
(58) Field of Classification Search .................. 365/158, 365/173
See application file for complete search history.

(56) References Cited

U.S. PATENT DOCUMENTS

| | | | |
|---|---|---|---|
| 6,714,444 B2 | 3/2004 | Huai | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,958,927 B1 | 10/2005 | Nguyen | |
| 6,967,863 B2 | 11/2005 | Huai | |
| 6,980,469 B2 | 12/2005 | Kent | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,161,829 B2 | 1/2007 | Huai | |

(Continued)

OTHER PUBLICATIONS

PCT Search Report and Written Opinion dated May 19, 2010.

(Continued)

*Primary Examiner* — Michael Tran (74) *Attorney, Agent, or Firm* — Mueting Raasch & Gebhardt PA (57) ABSTRACT

A magnetic data storage cell, applicable to spin-torque random access memory (ST-RAM), is disclosed. A magnetic cell includes first and second fixed magnetic layers and a free magnetic layer positioned between the fixed magnetic layers. The magnetic cell also includes terminals configured for providing a spin-polarized current through the magnetic layers. The first fixed magnetic layer has a magnetization direction that is substantially parallel to the easy axis of the free magnetic layer, and the second fixed magnetic layer has a magnetization direction that is substantially orthogonal to the easy axis of the free magnetic layer. The dual fixed magnetic layers provide enhanced spin torque in writing to the free magnetic layer, thereby reducing the required current and reducing the feature size of magnetic data storage cells, and increasing the data storage density of magnetic spin torque data storage.

19 Claims, 7 Drawing Sheets

U.S. PATENT DOCUMENTS

| | | |
|---|---|---|
| 7,190,611 B2 | 3/2007 | Nguyen |
| 7,230,845 B1 | 6/2007 | Wang |
| 7,233,039 B2 | 6/2007 | Huai |
| 7,241,631 B2 | 7/2007 | Huai |
| 7,242,048 B2 | 7/2007 | Huai |
| 7,242,631 B2 | 7/2007 | Fujioka |
| 7,245,462 B2 | 7/2007 | Huai |
| 7,369,427 B2 | 5/2008 | Diao |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,576,956 B2 | 8/2009 | Huai |
| 2005/0254286 A1 | 11/2005 | Valet |
| 2006/0007728 A1 | 1/2006 | Sundstrom |
| 2006/0104110 A1 | 5/2006 | Sun |
| 2007/0063237 A1 | 3/2007 | Huai |
| 2007/0297220 A1 | 12/2007 | Yoshikawa |
| 2008/0291721 A1 * | 11/2008 | Apalkov et al. ............... 365/173 |
| 2009/0050991 A1 | 2/2009 | Nagai |
| 2009/0219754 A1 * | 9/2009 | Fukumoto ................. 365/158 |
| 2009/0302403 A1 | 12/2009 | Nguyen |

OTHER PUBLICATIONS

Ja. Katine et al., Current-Driven Magnetization Reversal and Spin-Wave Excitations in Co/Cu/Co Pillars, Plys. Rev. Lett. vol. 84, pp. 3149-3152 (2000).

I.N. Krivorotov et al., "Time-Domain Measurements of Nanomagnet Dynamics Driven by Spin-Transfer Torques", Science vol. 307, pp. 228-231 (2005).

Jiang Xiao, A. Zangwill, MD. Stiles, "Boltzmann test of Slonczewski's theory of spin-transfer torque", Phys. Rev. Lett. B 70, pp. 172405-1, 172405-4 (2004).

F.B. Mancoff, et al., "Angular dependence of spin-transfer switching in a magnetic nanostructure", Applied Physics Letters vol. 83, pp. 1596-1598 (2003).

* cited by examiner

MAGNETIC RANDOM ACCESS MEMORY WITH DUAL SPIN TORQUE REFERENCE LAYERS

RELATED APPLICATIONS

This application is a continuation application of U.S. patent application Ser. No. 12/949,871, filed on Nov. 19, 2010; now U.S. Pat. No. 8,023,317, which is a continuation application of U.S. patent application Ser. No. 12/327,184, filed on Dec. 3, 2008, now U.S. Pat. No. 7,859,892. The entire disclosures of both are incorporated herein by reference.

BACKGROUND

Magnetic random access memory (MRAM), or spin torque RAM (STRAM), is a non-volatile solid-state data storage technology that has long shown promise, but has posed challenges in achieving competitive levels of storage density.

The discussion above is merely provided for general background information and is not intended to be used as an aid in determining the scope of the claimed subject matter.

SUMMARY

A magnetic data storage cell, applicable to spin-torque random access memory (ST-RAM), is disclosed. A magnetic cell includes first and second fixed magnetic layers and a free magnetic layer positioned between the fixed magnetic layers. The magnetic cell also includes terminals configured for providing a spin-polarized current through the magnetic layers. The first fixed magnetic layer has a magnetization direction that is substantially parallel to the easy axis of the free magnetic layer, and the second fixed magnetic layer has a magnetization direction that is substantially orthogonal to the easy axis of the free magnetic layer. The dual fixed magnetic layers provide enhanced spin torque in writing to the free magnetic layer, thereby reducing the required current and reducing the feature size of magnetic data storage cells, and increasing the data storage density of magnetic spin torque data storage.

The Summary and Abstract herein provide an illustrative introduction to certain aspects of selected embodiments, and are understood not to define any limitations or implications for how the scope of the claimed subject matter might be interpreted.

DETAILED DESCRIPTION

Figure 1:
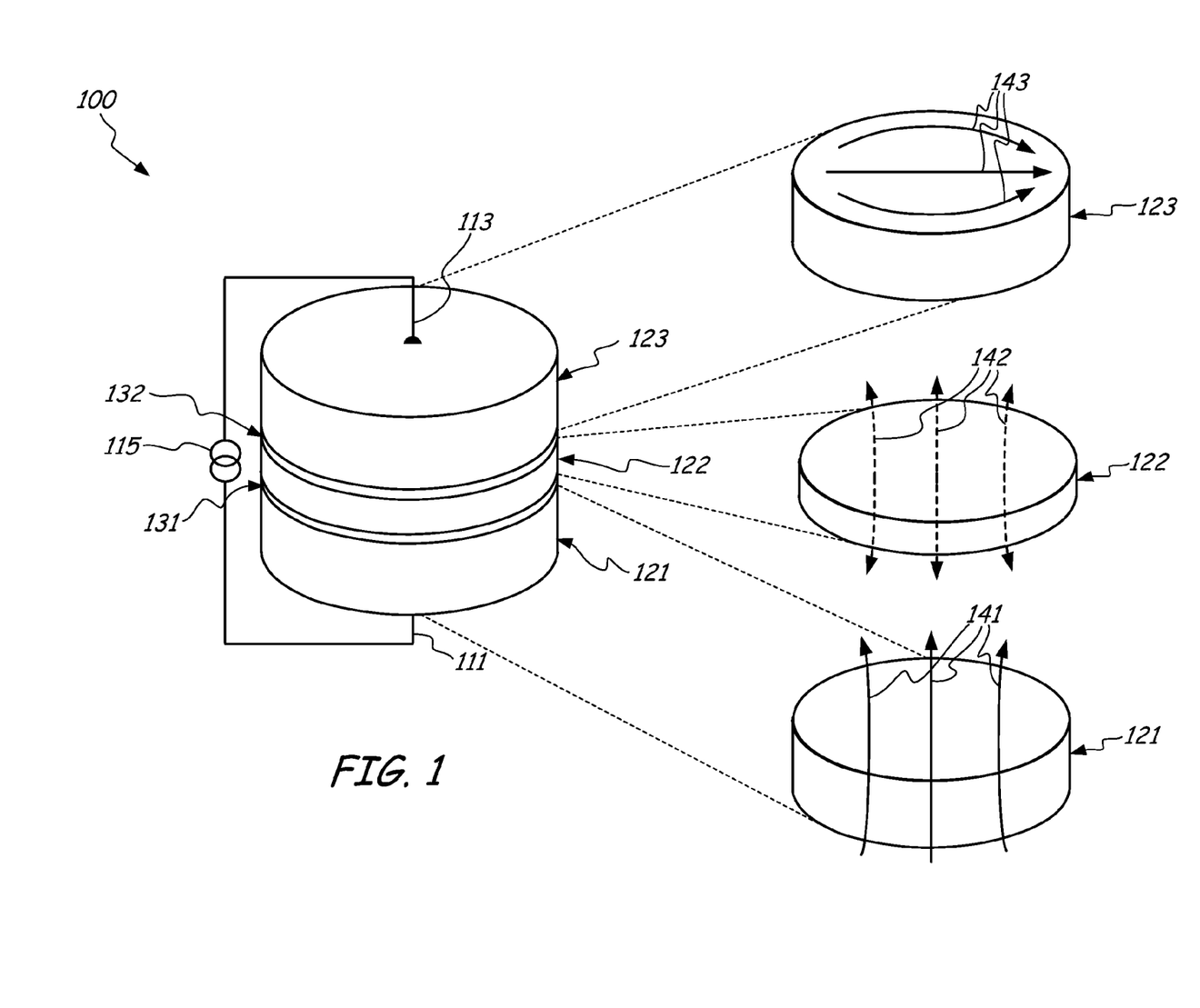
FIG. 1 depicts a perspective view of a magnetic data storage cell, with exploded views of magnetic layers of the cell with illustrated magnetization directions, in accordance with an illustrative example.

FIG. 1 depicts a perspective view of a magnetic data storage cell 100, with exploded views of magnetic layers 121, 122, 123 of the cell with illustrated magnetization directions, in accordance with an illustrative example. Many magnetic data storage cells such as magnetic cell 100 may be included together in a data storage device or other data storage system, and configured for storing data, in an illustrative embodiment. In this illustrative embodiment, dual fixed magnetic layers 121, 123, also referred to as reference layers, having complementary magnetization directions, provide enhanced spin torque in writing to the free magnetic layer 122, by switching the magnetization direction of the free magnetic layer 122, as is further described below.

The enhanced spin torque provided by the dual fixed magnetic layers 121, 123 enables the free magnetic layer 122 to be switched using a lower current, relative to a magnetic cell with just a single fixed magnetic layer. This lower current allows reducing the feature size of the magnetic data storage cell 100, relative to a magnetic cell with just a single fixed magnetic layer, and thereby enabling increased data storage density in a magnetic spin torque data storage that incorporates such magnetic data storage cells. In particular, magnetic cells with a single fixed reference layer may require a larger current than can be provided with integrated field-effect transistors (FET's) typical of integrated circuits, while in contrast, magnetic cells with dual fixed magnetic layers with complementary magnetization directions may function with a lower current that is within the normal current capabilities of an integrated circuit. These aspects are further described below.

The magnetic layers of cell 100 include a first fixed magnetic layer 121, a second fixed magnetic layer 123, and a free magnetic layer 122 positioned between the first and second fixed magnetic layers 121, 123. Magnetic layers 121 and 123 are fixed in that their magnetizations are each kept in a respective fixed direction, while magnetic layer 122 is free in that its magnetization is left free to align in either of two opposing directions along its easy axis, as further explained below. "Magnetization" may be understood to indicate magnetization direction as applicable. Magnetic cell 100 also includes terminals 111, 113 configured for providing a spin-polarized current through the stack of magnetic layers 121, 122, 123. Terminals 111, 113 are connected to node 115 which may connect to additional signal lines (not depicted in FIG. 1). The exploded views of the magnetic layers show magnetization direction 141 of fixed magnetic layer 121, indicative of the fixed magnetization direction of magnetic layer 121; magnetization direction 143 of fixed magnetic layer 123, indicative of the fixed magnetization direction of magnetic layer 123; and magnetization direction 142 of free magnetic layer 122, indicative of the easy axis of magnetic layer 122.

The magnetization of magnetic layer 121 has a perpendicular orientation, also sometimes referred to as out-of-plane or vertical orientation, with the magnetization oriented generally perpendicular to the flat, extended circular surfaces of the layer. The magnetization of magnetic layer 123 has a diametrical orientation, also sometimes referred to as in-plane orientation, and oriented generally parallel to the flat surfaces of the layer. As those skilled in the art will recognize, these descriptions, including "generally orthogonal" and "generally parallel" are simplified and do not account for the complete description of the magnetization within each of the layers or indicate precisely orthogonal or precisely parallel, but are useful in identifying the general orientation of the magnetizations, as would be understood by a person of ordinary skill in the art when considering the relative orientations of the magnetization directions.

The magnetization directions 141, 143 of the fixed magnetic layers are each depicted as solid lines, each with an arrowhead on only one end thereof, indicating that the magnetization directions of these magnetic layers are fixed, while the magnetization direction 142 of free magnetic layer is depicted as dashed lines with arrowheads on both ends thereof, indicating that this magnetization direction is indicative of an easy axis, and the magnetization of the layer may be aligned with either polarity of the easy axis with substantially equal stability. Ideally this will be equal stability, or may be within nominal manufacturing tolerances of equal stability, such that if the magnetization direction of the free magnetic layer is disrupted and allowed to proceed in the absence of environmental influences, the magnetization direction would be equally likely to return to either direction in line with the easy axis.

The easy axis of the free magnetic layer 122 is set in the perpendicular orientation, in alignment with the magnetization direction 141 of fixed magnetic layer 121, in the illustrative embodiment of FIG. 1. Therefore, the first fixed magnetic layer 121 has a magnetization direction 141 that is substantially parallel to the easy axis of the free magnetic layer 122, and the second fixed magnetic layer 123 has a magnetization direction 143 that is substantially orthogonal to the easy axis of the free magnetic layer 122, in the illustrative embodiment of FIG. 1. The magnetization direction 142 of the free magnetic layer 122 at any time is predisposed to stable alignment with the easy axis, either parallel or antiparallel to the fixed magnetization direction 141 of magnetic layer 121. The magnetization directions are "substantially" parallel and "substantially" orthogonal in a sense that is further discussed below, with reference to FIG. 2.

The easy axis may be set by various techniques which may illustratively include shape anisotropy or magnetocrystalline anisotropy in the free magnetic layer. In the fixed magnetic layers 121 and 123, the magnetization direction of each of the layers may be kept in a fixed orientation by any of various techniques, such as having the fixed magnetic layers each have a substantially greater magnetic volume than the free magnetic layer, or by having the fixed magnetic layers magnetically pinned, for example.

The orientation of the magnetization may also be a function of the dimensions of the layer. For example, absent magnetic pinning, a layer having an easy axis (and magnetization) in a diametrical magnetic orientation generally correlates with a relatively larger radius and relatively smaller vertical thickness, while a layer having an easy axis (and magnetization) in a perpendicular magnetic orientation generally correlates with a relatively smaller radius and relatively larger vertical thickness.

In particular, having the perpendicular easy axis for the free magnetic layer 122 may increase the amount of anisotropy energy density of the free layer relative to other easy axis orientations, in this particular embodiment. This may enable magnetic cell 100 to have a relatively small size with relatively larger magnetic stability, compared with other orientations. A significant constraint on how small magnetic cell 100 can be, while still functioning reliably, is resistance to random reversals of the magnetization direction of free magnetic layer 122 due to random thermal fluctuations. The stability of the magnetization direction of the free magnetic layer against thermal disturbances can be modeled as $K_\mu V/kT$, where $K_\mu$ is magnetic anisotropy energy density, V is the volume of the magnetic layer, k is Boltzmann's constant, and T is temperature. In one illustrative embodiment, a value for $K_\mu V/kT$ of at least approximately 60 (with no units, because x is a dimensionless ratio) is used as a design standard for maintaining the magnetic stability of the free magnetic layer 122.

The magnetic layers 121, 122, 123 may be composed at least in part of a ferromagnetic material. Examples of ferromagnetic materials that may be used for the compositions of the magnetic layers include iron, cobalt, nickel, Permalloy, Heusler alloys, or any other ferromagnetic materials. Heusler alloys that may be used may, for example, be composed of a combination of two parts of copper, nickel, cobalt, or a combination thereof; one part manganese, chromium, iron, or a combination thereof; and one part tin, aluminum, silicon, arsenic, antimony, bismuth, or boron, or a combination thereof. Those skilled in the relevant arts will recognize additional selections of materials that may be well-suited for a given application.

The intermediate, non-magnetic interlayer 131 is positioned between fixed magnetic layer 121 and free magnetic layer 122, and intermediate, non-magnetic interlayer 132 is positioned between free magnetic layer 122 and fixed magnetic layer 123, in the illustrative embodiment of FIG. 1. Interlayers 131, 132 may be configured to contribute to different technologies for magnetic cell 100, such as quantum tunneling magnetoresistance (TMR) or giant magnetoresistance (GMR), for example. One type of interlayer that may be used is a tunnel barrier, configured for quantum tunneling magnetoresistance. For example, the tunnel barrier may be composed of an electrically insulating material, such as a metal oxide that may include AlO, TaO, MgO, or any other oxide of aluminum, tantalum, titanium, magnesium, or other appropriate elements or combinations thereof, or other electrically insulating materials. Another type of interlayer that may be used is an electrically conducting metal layer configured for giant magnetoresistance. Such an intermediate layer may be composed of a high-conductance metal such as gold, silver, copper, or aluminum, for example. Other types of intermediate layers configured for other purposes, such as interlayers composed of a semiconductor, may be used in various other embodiments.

Various embodiments may also combine quantum tunneling magnetoresistance and giant magnetoresistance techniques in the same cell. This may be correlated with optimizing both read and write operations on the same magnetic cell with the same single terminals 111, 113 on each end of the magnetic cell, in an illustrative embodiment. For example, in an illustrative embodiment corresponding with FIG. 1, first interlayer 131 may be composed of an insulating material for quantum tunneling magnetoresistance, while second interlayer 132 may be composed of a conducing material for giant magnetoresistance. In this illustrative embodiment, first interlayer 131, which separates free magnetic layer 122 from the fixed magnetic layer 121 that has a parallel easy axis and which is used to set the magnetization direction of the free magnetic layer 122, by being composed of an insulating material for quantum tunneling magnetoresistance, may provide for a larger output signal for a read operation. On the other hand, second interlayer 132, which separates free magnetic layer 122 from the fixed magnetic layer 123 that has a perpendicular easy axis and which is used for providing the initial torque boost on the magnetization direction of the free magnetic layer 122, by being composed of a conducting material for giant magnetoresistance, could provide for a lower total impedance of the magnetic cell, among other advantages.

The magnetic cell 100 is thereby enabled to provide dual, complementary spin torques to the free magnetic layer 122, to use a relatively low electric current to store data in magnetic cell 100 in the form of which direction along the easy axis the magnetization direction of free magnetic layer 122 is oriented. How magnetic cell 100 provides these complementary torques and thereby encodes data with relatively low current is further described with reference to FIG. 2.

Figure 2:
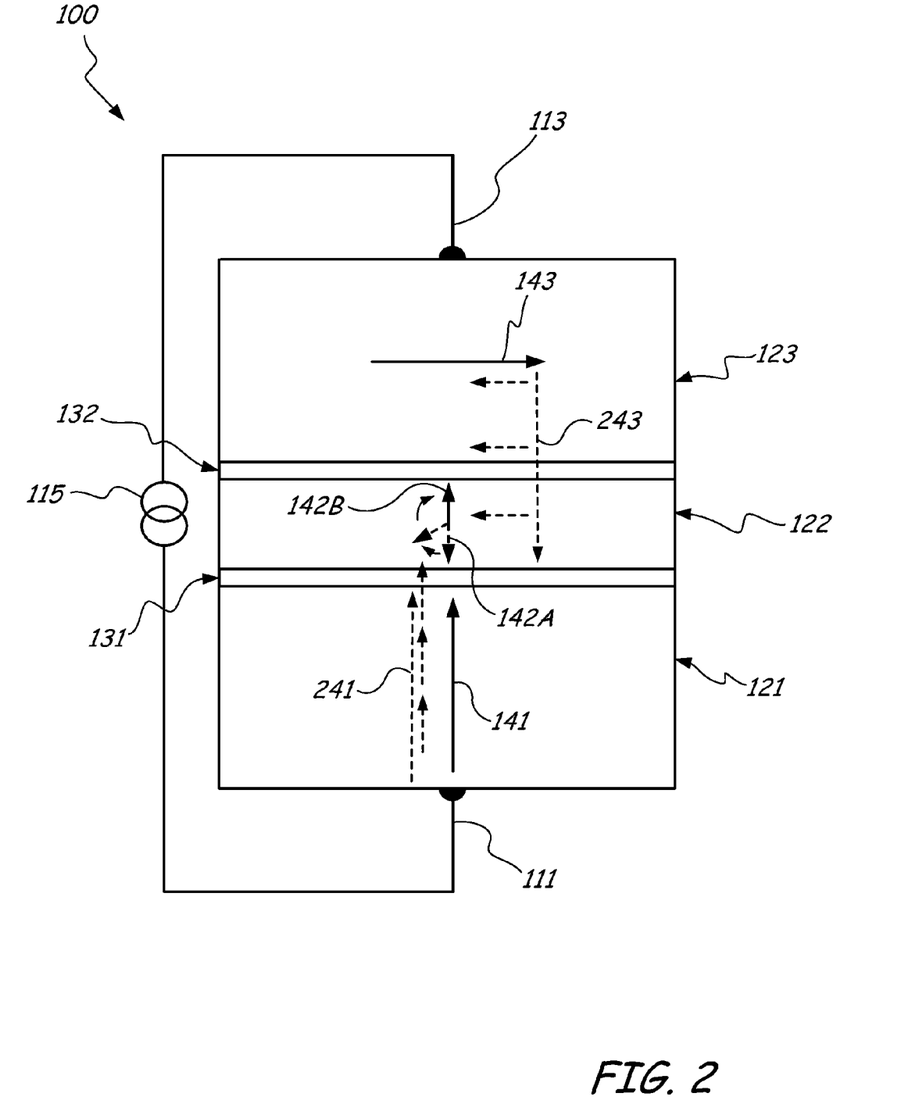
FIG. 2 depicts a side plan view of a magnetic data storage cell, with schematic depictions of magnetization directions and of spin torques being applied in the cell, in accordance with an illustrative example.

FIG. 2 depicts a side plan view of magnetic data storage cell 100 corresponding to the embodiment depicted in FIG. 1, with schematic depictions of magnetization directions 141, 142A, 142B, 143, and of spin torques 241, 243 being applied in the cell. In FIG. 2, a spin-polarized current is being passed through magnetic cell 100, with current running from terminal 113 to terminal 111, i.e. with electrons propagating from terminal 111 to terminal 113. As this spin-polarized current passes from fixed magnetic layer 121 with magnetization direction 141, it exerts a spin torque 241 on free magnetic layer 122; and as this spin-polarized current passes from fixed magnetic layer 123 with magnetization direction 143, it exerts a spin torque 243 on free magnetic layer 122. As depicted in FIG. 2, free magnetic layer 122 initially has magnetization direction 142A, oriented antiparallel to the magnetization direction of fixed magnetic layer 121, i.e. oriented downward as depicted. The action of the spin-polarized current passing through the magnetic cell 100, and the spin torques 241, 243 resulting from the spin-polarized current associated with the fixed magnetic layers 121, 123, causes the magnetization direction of free magnetic layer 122 to flip to magnetization direction 142B, parallel to the magnetization direction 141 of fixed magnetic layer 121.

Specifically, the spin torque 243 gives an initial spin torque boost to magnetization direction 142A to knock it off of the easy axis of free magnetic layer 122 more rapidly and with more initial torque than would be possible with the spin torque 241 from fixed magnetic layer 121 alone; while the spin torque 241 from fixed magnetic layer 121 provides more torque during the middle of the process of reversing the magnetization direction of free magnetic layer 122, and determines the final magnetization direction 142B of free magnetic layer 122 at the end of the write process. These aspects are further explained with reference to FIG. 3 and FIG. 4, below.

The capability of manipulating the magnetic orientation of the magnetic layers is discussed in additional detail as follows. When a spin-polarized current passes through a magnetic material, the transfer of angular momentum from the spins exerts a torque on the magnetization direction of the material. In magnetic stacks with fixed magnetic layers, and a free layer, such as fixed layers 121, 123 and free layer 122 of FIG. 1 and FIG. 2, the spin-polarized current transfers angular momentum from the magnetization of each of the fixed layers to the free layer, exerting a torque on the magnetization of the free layer. In the magnetic element 110 the current is driven vertically through the stack, between terminals 111 and 113, such that for a positive bias (electron flow from lower terminal 111 to upper terminal 113), spin torque drives the free layer 122 to a final magnetization direction 142B parallel to the magnetization of the fixed layer 121 with the parallel easy axis, as depicted in FIG. 2. For a negative current bias (electron flow from upper terminal 113 to lower terminal 111), spin torque drives the free layer 122 to a final magnetization direction 142A antiparallel to the magnetization direction of the fixed layer 121 with the parallel easy axis (i.e. the opposite of the process depicted in FIG. 2).

The Landau-Lifshitz-Gilbert Equation is applicable to describe this effect on the free layer dynamics for the free magnetic layer with reference to each of the fixed magnetic layers, by incorporating the effects of the magnetization from a spin-polarized current, so the rate of change of the free magnetic layer 122 can be determined as follows:

$$\frac{d\vec{M}_{free}}{dt} = -\frac{\mu_0 \gamma \vec{M}}{(1+\alpha^2)} \times \vec{H} - \frac{\mu_0 \gamma \alpha}{M_{S_{free}}(1+\alpha^2)} \vec{M}_{free} \times (\vec{M}_{free} \times \vec{H}) + \frac{\hbar}{2e} \frac{(\varepsilon I)}{V} \frac{\gamma}{M_{S_{free}}^2 M_{S_{fixed}}} \vec{M}_{free} \times (\vec{M}_{free} \times \vec{M}_{fixed})$$

where I is the current flowing perpendicular to the plane (CPP) of the magnetic layers, $M_{sfree}$ is the free-layer saturation magnetization, $M_{sfixed}$ is that of the fixed layer, $\varepsilon$ is an efficiency factor related to the spin polarization of the current, V is the volume of the free layer, and $\mu_0$ is the magnetic permeability of free space. Solutions to this equation yield a critical current density, $J_c$, beyond which the magnetization of the free layer can be driven either parallel or antiparallel to the fixed layer having the parallel easy axis, depending on the direction of current flow.

With magnetic cell 100 of FIG. 1 and FIG. 2, each of the two fixed magnetic layers 121, 123 exerts a torque on the magnetization of free magnetic layer 122, and both the rate of change in magnetization 142 of the free magnetic layer 122 and the critical current density must be figured as determined by the equation above with contributions from each of the fixed magnetic layers 121, 123, which drives the rate of change of the magnetization of free magnetic layer 122 much higher, and the critical density much lower, than with a single fixed magnetic layer. (While the magnetization direction of free magnetic layer 122 is depicted in particular orientations labeled 142A and 142B in FIG. 2, it is referred to generically herein as magnetization direction 142 or magnetization 142.) In particular, the torque on the magnetization of free magnetic layer 122 is approximately proportional to the cross products of the magnetizations of an adjacent magnetic layer and of the free magnetic layer, i.e. the magnitudes of the magnetizations times the sine of the angle between them. This is illustrated in graph 300 of FIG. 3.

Figure 3:
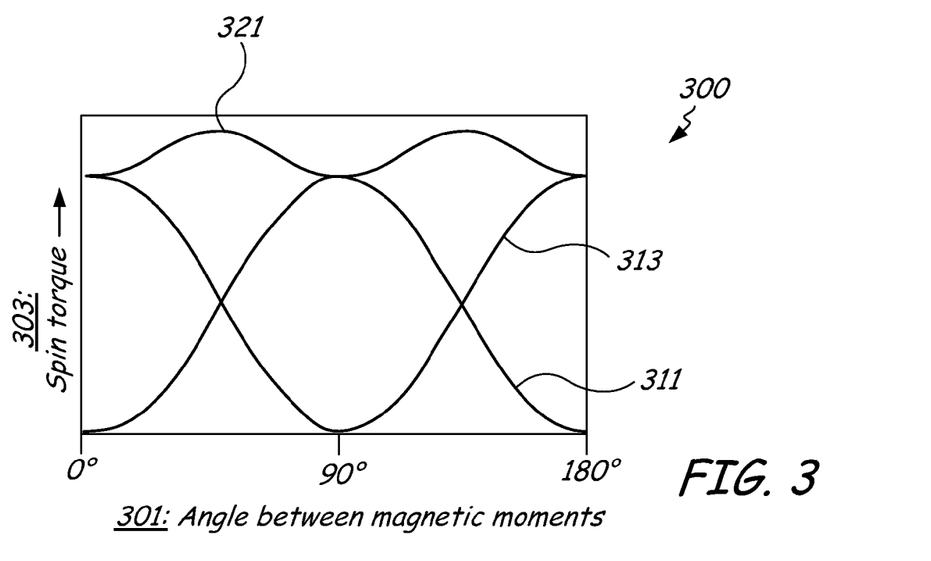
FIG. 3 depicts a graphical representation of a superposition of multiple spin torques acting within a cell as a function of angles between magnetization directions, in accordance with an illustrative example.

FIG. 3 depicts a graphical representation 300 of a superposition of multiple spin torques acting within a cell as a function of angles between magnetization directions, in accordance with an illustrative example. In particular, with reference to the illustrative embodiment of FIGS. 1 and 2, torque component 311 represents the magnitude of the spin torque exerted on the magnetization direction of free magnetic layer 122 by fixed magnetic layer 121, and torque component 313 represents the magnitude of the spin torque exerted on the magnetization direction of free magnetic layer 122 by fixed magnetic layer 123.

The rate of change that the magnetization direction of free magnetic layer 122 would have, if affected only by the single fixed magnetic layers individually, would be proportional to the spin torques as depicted. Because the magnetization direction 141 of fixed magnetic layer 121 is initially antiparallel or parallel to the magnetization direction 142 of free magnetic layer 122, its spin-polarized current initially has a very small torque on the magnetization direction 142 of free magnetic layer 122, i.e. it is approximately proportional to zero (i.e. the sine of zero), and in actuality it is proportional to small-scale corrections to the modeling of the torque that make it not quite zero. The torque and corresponding rate of change of the magnetization direction 142 of free magnetic layer 122 due to the parallel-moment fixed magnetic layer 121 are therefore quite low at the initiation of a write process. In a magnetic cell with only a single fixed magnetic layer, this very low initial rate of change would be a substantial constraint on the speed and performance of the entire magnetic cell, and of any device that incorporated such magnetic cells. As depicted in component 311 of graph 300, the torque associated with magnetization direction 141 of fixed magnetic layer 121 then rises until reaching the full magnitude of the product of the magnetizations 141, 142 of fixed magnetic layer 121 and free magnetic layer 122 respectively, in the middle of a write process, when the magnetization direction of the free magnetic layer 122 is in the middle of flipping and is perpendicular to the magnetization direction 141 of fixed magnetic layer 121.

At the same time, as depicted in component 313 of graph 300, the magnetization direction 143 of perpendicular-moment fixed magnetic layer 123 is initially perpendicular to the magnetization direction 142 of free magnetic layer 122. The spin angular momentum associated with magnetization direction 143 therefore provides the maximum torque on the magnetization direction 142 of free magnetic layer 122 at the initiation of a write process, i.e. its torque is approximately proportional to 1 (i.e. the sine of 90 degrees) times the product of the magnitudes of magnetizations 142, 143 of free magnetic layer 122 and fixed magnetic layer 123 respectively, at the initiation of the write process. The torque from the perpendicular-moment fixed magnetic layer 123 also rises again at the end of the write process, when the torque from the parallel-moment fixed magnetic layer 121 is dropping again.

The parallel-moment fixed magnetic layer 121 and the perpendicular-moment fixed magnetic layer 123 therefore exert torques that are complementary to each other, and together impose a continuously high torque on the magnetization 142 of free magnetic layer 122 throughout a write process. As depicted in graph 300, torque components 311 and 313 superpose to form total torque 321, which remains at or above the maximum torque provided by either fixed magnetic layer alone, throughout the write process. This provides much faster switching of the magnetization direction 142 of the free magnetic layer 122 than is possible without the dual, complementary fixed magnetic layers of magnetic cell 100. Besides a much lower length of time required for switching, it also enables a much lower level of critical current required for switching. Because the energy required to impose the free layer magnetization switching for a write operation is proportional to the product of the time and the square of the current, and both the time and the current are lower for dual reference layer magnetic cell 100 than with a single reference layer, the energy required for a write operation is also much lower for magnetic cell 100 than for a cell with only one fixed magnetic layer.

Figure 4:
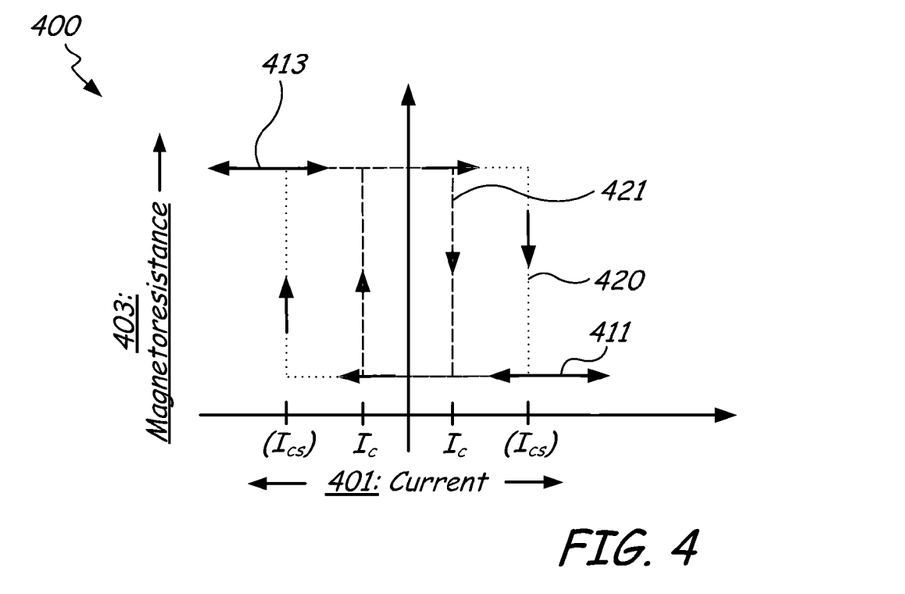
FIG. 4 depicts a comparative graphical representation of magnetoresistance as a function of current for different magnetic cells, in accordance with an illustrative example.

FIG. 4 depicts a comparative graphical representation 400 of magnetoresistance 403 as a function of current 401 for different magnetic cells, in accordance with an illustrative example consistent with the embodiments discussed above. Graph 400 further illustrates the benefit of the lower required current as discussed above. Graph 400 represents certain relationships between current and magnetoresistance both for dual reference layer magnetic cell 100, and for a hypothetical magnetic cell with only a single fixed magnetic layer and a single free layer, for comparison. In graph 400, a magnetic cell with a single free magnetic layer at a point in time may have either a lower magnetoresistance 411 or a higher magnetoresistance 413, where the lower value 411 corresponds to the magnetization direction of the free magnetic layer being parallel to the magnetization direction of the parallel-easy-axis fixed magnetic layer (such as fixed magnetic layer 121 in magnetic cell 100, or which is the only fixed layer in a cell with a single fixed layer), and the higher value 413 corresponds to the magnetization direction of the free magnetic layer being antiparallel to the magnetization direction of the parallel-easy-axis fixed magnetic layer. Current must be applied in the positive-x direction to the value of the critical current to switch the free layer from antiparallel to parallel and drop from higher magnetoresistance 413 to lower magnetoresistance 411. On the other hand, current must be applied in the negative-x direction to the value of the critical current to switch the free layer from parallel to antiparallel and go from lower magnetoresistance 411 to higher magnetoresistance 413. The value of the critical current is different for the two cells, however.

In a magnetic cell with only one fixed magnetic layer, the weakness of the initial torque (proportional to the lone torque component 311 in FIG. 3) must be compensated for with a large current to switch the magnetization direction of the free magnetic layer. This relatively large critical current for a single-fixed-layer cell is indicated as $I_{cs}$ in FIG. 4, and is at larger values of current in both the positive-x and negative-x directions in graph 400. Current 420 is depicted for a single-fixed-layer cell that has been provided the critical current $I_{cs}$, and is switching from higher to lower magnetoresistance (or vice-versa on the negative-x side). On the other hand, in a magnetic cell 100 with dual reference layers, one fixed magnetic layer 121 with a magnetization direction 141 parallel to the easy axis of the free layer 122, and another fixed magnetic layer 123 with a magnetization direction 143 perpendicular to the easy axis of free layer 122, the critical current for switching the magnetization direction of free layer 122 is lower. This relatively small critical current for a dual-fixed-layer cell is indicated as $I_c$ in FIG. 4, and is at smaller values of current in both the positive-x and negative-x directions in graph 400. Current 421 is depicted for a dual-fixed-layer cell that has been provided the critical current $I_c$ and is switching from higher to lower magnetoresistance (or vice-versa on the negative-x side).

While the discussion above is provided in the context of performing write operations to magnetic cell 100, read operations may also be performed in a similar manner and through the same terminals 111, 113, but with less than the critical current. A read operation may be performed on magnetic cell 100 by providing a read query current to magnetic cell 100 with less than the critical current. This read query current experiences either the higher level of magnetoresistance 413 or the lower level of magnetoresistance 411 in magnetic cell 100, and returns as a read response voltage equal to the product of the current and resistance that carries the information of what magnetic state the free layer 122 is in at that particular magnetic cell. In more physical detail, if the magnetic cell has the magnetization direction of the free magnetic layer 122 aligned parallel to the magnetization direction of the determining reference layer, i.e. the fixed magnetic layer 121 with the magnetization direction parallel to the easy axis of free magnetic layer 122, and a read current of either polarity is provided through the cell, then it experiences a low magnetoresistance, and the output voltage is low. On the other hand, if the magnetic cell has the magnetization direction of the free magnetic layer 122 aligned antiparallel to the magnetization direction of fixed magnetic layer 121, and a read current is provided through the cell then it experiences a high magnetoresistance, and the output voltage is high, as sensed through the node 115.

Figure 5:
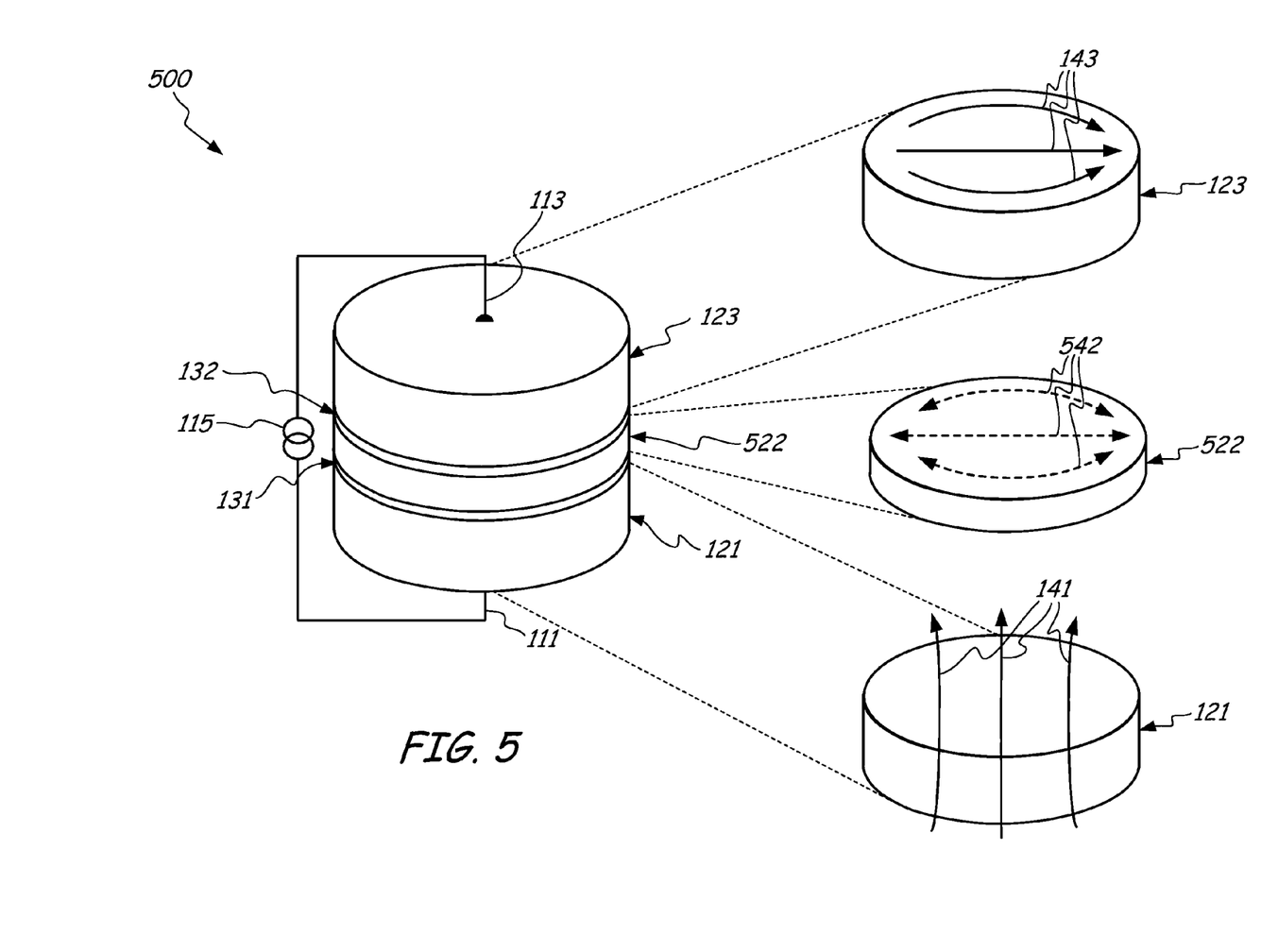
FIG. 5 depicts a perspective view of a magnetic data storage cell, with exploded views of magnetic layers of the cell with magnetization directions, in accordance with another illustrative example.

FIG. 5 depicts a perspective view of a magnetic data storage cell 500, with exploded views of magnetic layers 121, 522, 123 of the cell with magnetization directions 141, 542, 143, in accordance with another illustrative example that has some similarities with and some differences from the illustrative embodiment of magnetic cell 100 in FIGS. 1 and 2. Magnetic cell 500 has many identical components to magnetic cell 100 of FIGS. 1 and 2, including fixed magnetic layers 121 and 123, interlayers 131 and 132, terminals 111 and 113, and node 115. The magnetization of the first fixed magnetic layer 121 is oriented in the perpendicular orientation, as depicted by magnetization direction 141, and the magnetization of the second fixed magnetic layer 123 is oriented in the diametrical orientation, as depicted by magnetization direction 143. Magnetic cell 500 also includes free magnetic layer 522, in which the easy axis is oriented in a diametrical orientation, as depicted with magnetization direction 542. The easy axis of free magnetic layer 522 is therefore parallel to the magnetization direction of fixed magnetic layer 123.

As with magnetic cell 100, magnetic cell 500 may also exert simultaneous perpendicular spin torques on free magnetic layer 522, i.e. spin torques that are perpendicular to each other and where one of them is perpendicular to the easy axis of free magnetic layer 522 and one spin torque is parallel to the easy axis of free layer 522. In this case, it is fixed magnetic layer 123 with the magnetization direction that is parallel to the easy axis of free magnetic layer 522 and that provides spin torque that is parallel or antiparallel to the magnetization direction of free layer 522, while fixed magnetic layer 121 has the magnetization direction that is orthogonal to the easy axis of free magnetic layer 522 and that provides spin torque that is orthogonal to the magnetization direction of free layer 522. Having the free layer 522 with diametrical easy axis may be advantageous in various illustrative embodiments; for example when the free layer has a relatively high ratio between its radius and its thickness, the diametrical orientation may be more natural and hold its magnetization direction with more stability, in various embodiments.

Figure 6:
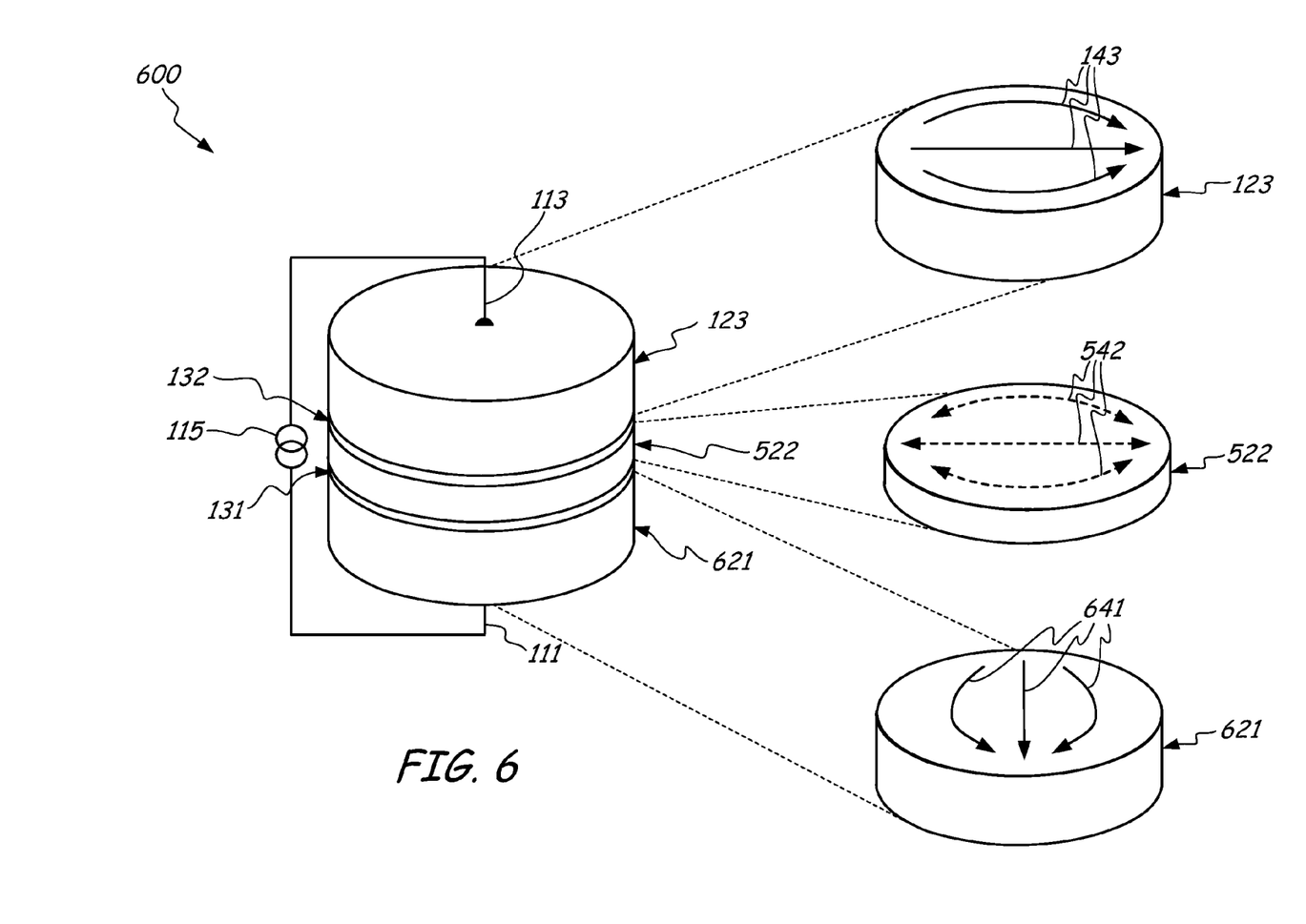
FIG. 6 depicts a perspective view of a magnetic data storage cell, with exploded views of magnetic layers of the cell with magnetization directions, in accordance with another illustrative example.

FIG. 6 depicts a perspective view of a magnetic data storage cell 600, with exploded views of magnetic layers 621, 522, 123 of the cell with magnetization directions 641, 542, 143, in accordance with another illustrative example, in which all three magnetic layers have their magnetization directions and easy axes in diametrical or in-plane orientations. Again, many of the components are the same as in magnetic cells 100 and 500 of FIGS. 1, 2, and 5, including fixed magnetic layer 123 as in magnetic cell 100, and free magnetic layer 522 as in magnetic cell 500. Magnetic cell 600 also has fixed magnetic layer 621, in which the magnetization is oriented in a second diametrical orientation that is oriented substantially orthogonal to the diametrical orientation of the magnetization of fixed magnetic layer 123 and of the easy axis of free magnetic layer 522. While all the magnetization directions are now in diametrical orientations, the same pattern applies once again in which one of the fixed magnetic layers (123) has its magnetization direction parallel to the easy axis of the free magnetic layer (522), and the other fixed magnetic layer (621) has its magnetization direction orthogonal to the easy axis of the free magnetic layer. Therefore, in the same way once again, spin-polarized currents provided through the magnetic cell 600 may be used to switch the magnetization direction of the free magnetic layer 522, where orthogonal-axis fixed magnetic layer 621 acts as the torque booster layer, to complement the determining reference layer to provide the large initial boost of torque to enable a faster switching process with a lower current, while parallel-axis fixed magnetic layer 123 acts as the determining reference layer, providing the torque in the orientation in which the magnetization of free layer 522 will come to rest. The embodiment of magnetic cell 600 may provide unique advantages in various embodiments, for example when all the layers have a relatively high ratio of radius to thickness, so that the diametrical orientation may be more natural and may be maintained with higher stability and lower energy or lesser magnetic pinning resources in the case of the fixed magnetic layers 621, 123, as an illustrative example.

Figure 7:
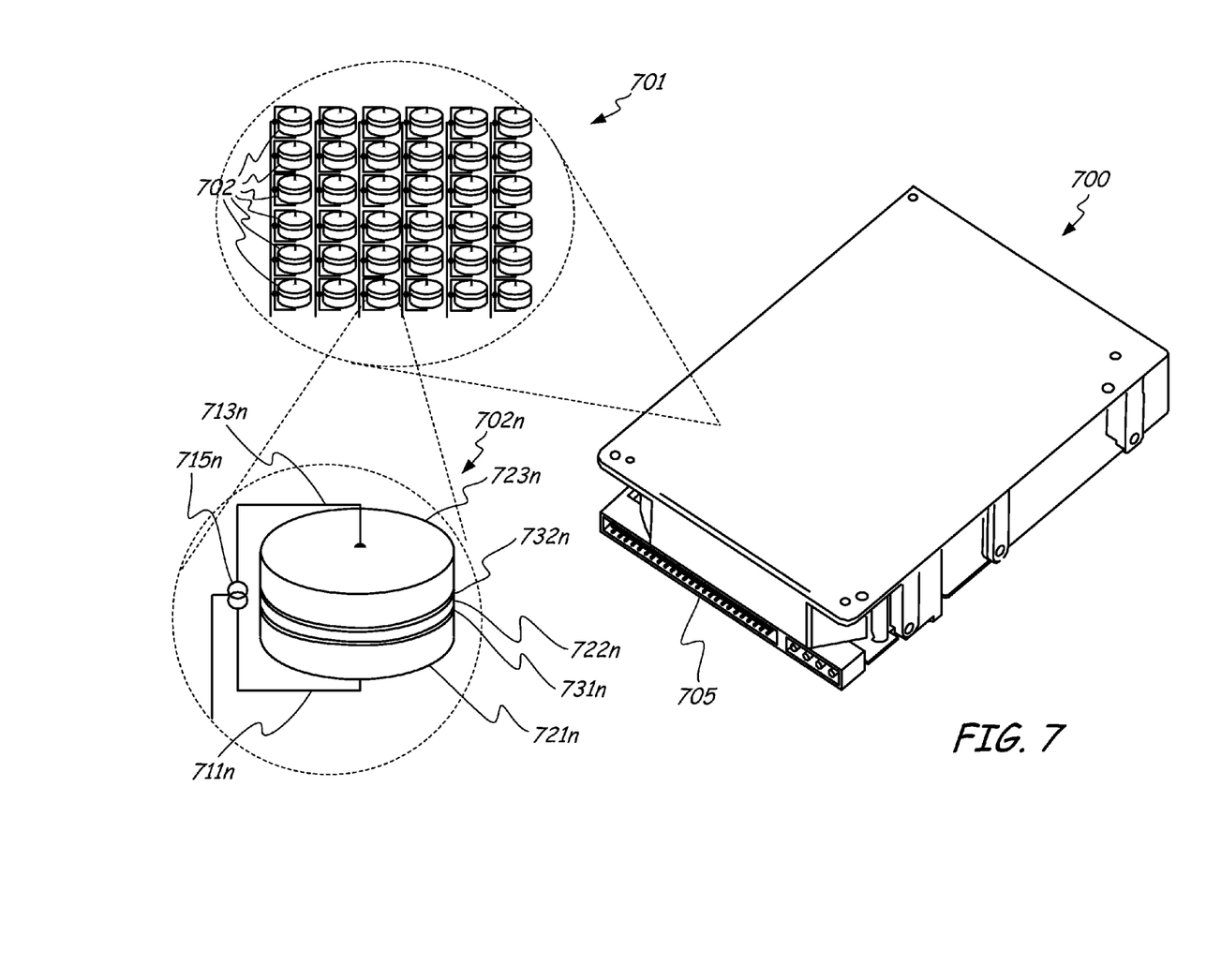
FIG. 7 depicts a data storage system comprising magnetic data storage cells, in accordance with another illustrative example.

FIG. 7 depicts a data storage system 700 comprising magnetic data storage cells, in accordance with another illustrative example. Data storage system 700 includes a plurality of magnetic data storage cells, such as the illustrative sample 701 of data storage cells 702 shown in a magnified internal view from within data storage system 700. The illustrative sample 701 of data storage cells 702 is not represented to scale, and various embodiments of data storage systems may include any number, potentially up through the millions, billions, trillions, or far more, of operably connected dual-reference-layer magnetic data storage cells, like any of magnetic cells 100, 500, 600 discussed above. And while data storage system 700 is depicted as a single device in the illustrative example of FIG. 7, other embodiments of data storage systems may include any number of networked or otherwise connected data storage devices, and may include a variety of different types of devices including some comprising compound magnetic data storage cells and others not, distributed over any volume of space. While the array of data storage cells 702 depicted in sample 701 with operable signal lines connected to all the nodes and terminals (like node 115 and terminals 111, 113 in the embodiments discussed above) of the cells 702, this depiction is simplified, and any operable design for sending signals to and receiving signals from the individual magnetic cells may be employed in different embodiments.

Magnetic data storage cells 702 contained within data storage system 700 include representative magnetic cell 702n, which is depicted in a separate and further magnified view. Representative magnetic data storage cell 702n includes first terminal 711n, second terminal 713n, and magnetic cell 702n that includes three substantially cylindrical magnetic layers 721n, 722n, and 723n, along with interlayers 731n, 732n positioned between the adjacent pairs of magnetic layers. Magnetic layers 721n and 723n are fixed magnetic layers, while positioned between them is free magnetic layer 722n. Magnetic cell 710n and magnetic layers 721n, 722n, and 723n may take the form of any of magnetic cells 100, 500, or 600 of the embodiments discussed above, with their respective magnetic layers, or any other analogous magnetic cell and arrangement of magnetic layers.

In magnetic cell 702n, terminal 711n and terminal 713n are configured for providing a spin-polarized current through the magnetic data storage cell 702n. Fixed magnetic layer 721n is positioned proximate to the first terminal 711n, and fixed magnetic layer 723n is positioned proximate to the second terminal 713n. "Proximate" to a terminal may mean connected to, or at least substantially closer than any of the other layers are, while it may be consistent with additional layers, coatings, sub-terminals, or components within the area around or between the terminals and the magnetic layers, for example. Free magnetic layer 722n is positioned between the first and second fixed magnetic layers 721n, 723n. As in the embodiments discussed above, one of fixed magnetic layers 721n, 723n has a fixed magnetization direction that is substantially orthogonal to the magnetization direction of the other one of fixed magnetic layers 721n, 723n, and the free magnetic layer 722n has an easy axis that is substantially parallel to a magnetization direction of a parallel-axis determining primary reference layer, the primary reference layer comprising either of fixed magnetic layers 721n, 723n. This predisposes the free magnetic layer 722n to have a magnetization direction either parallel or antiparallel to the magnetization direction of the primary reference layer, in accordance with write operations as discussed above.

The representative magnetic data storage cell 702n may define a vertical axis that runs generally between the terminals 711n, 713n and generally perpendicular to the magnetic layers 721n, 722n, 723n, in an illustrative embodiment. The magnetization direction of the first fixed magnetic layer 721n may be oriented generally parallel to the vertical axis, the magnetization direction of the second fixed magnetic layer 723n may be oriented either generally parallel or generally orthogonal to the vertical axis, and the easy axis of the free magnetic layer 722n may be oriented generally parallel to the magnetization direction of either the first fixed magnetic layer or the second fixed magnetic layer, in analogy to the various embodiments discussed above with reference to FIGS. 1, 5, and 6, in various illustrative embodiments.

Data storage system 700 is configured to provide write signals and read signals via the signal connections, whereby the write signals cause spin-polarized currents having a current density above a critical value to be provided through the magnetic data storage cells 702 to controllably set the magnetization direction of the free magnetic layers of the magnetic data storage cells 702, and the read signals cause spin-polarized currents having a current density below the critical value to be provided through the magnetic data storage cells to generate a read output signal that indicates the magnetization direction of the free magnetic layers 722 of the magnetic data storage cells 702.

In this way, the data storage system 700 may store large amounts of data encoded in the magnetization directions of the free magnetic layers of the many magnetic cells 702 of data storage system 700, and may perform read and write operations on the magnetic cells 702 with high speed and low current, as discussed above. In an illustrative embodiment, the current required may be low enough that it is more compatible with integrated semiconductor elements that enable operation of the storage cells, such as field effect transistors (FET's) that are typical components of such a storage device. Additionally, the current required may be low enough that it can be provided by standard integrated circuit current sources, rather than requiring large or bulky devoted current sources to power the magnetic cells. The low current also contributes to low rate of energy consumption, low waste heat and a low contribution to system cooling requirements, and prolonged battery life in the case of data storage in a portable device context. The fast switching times and high read and write operations contribute to high-speed performance of the data storage system 700.

Figure 8:
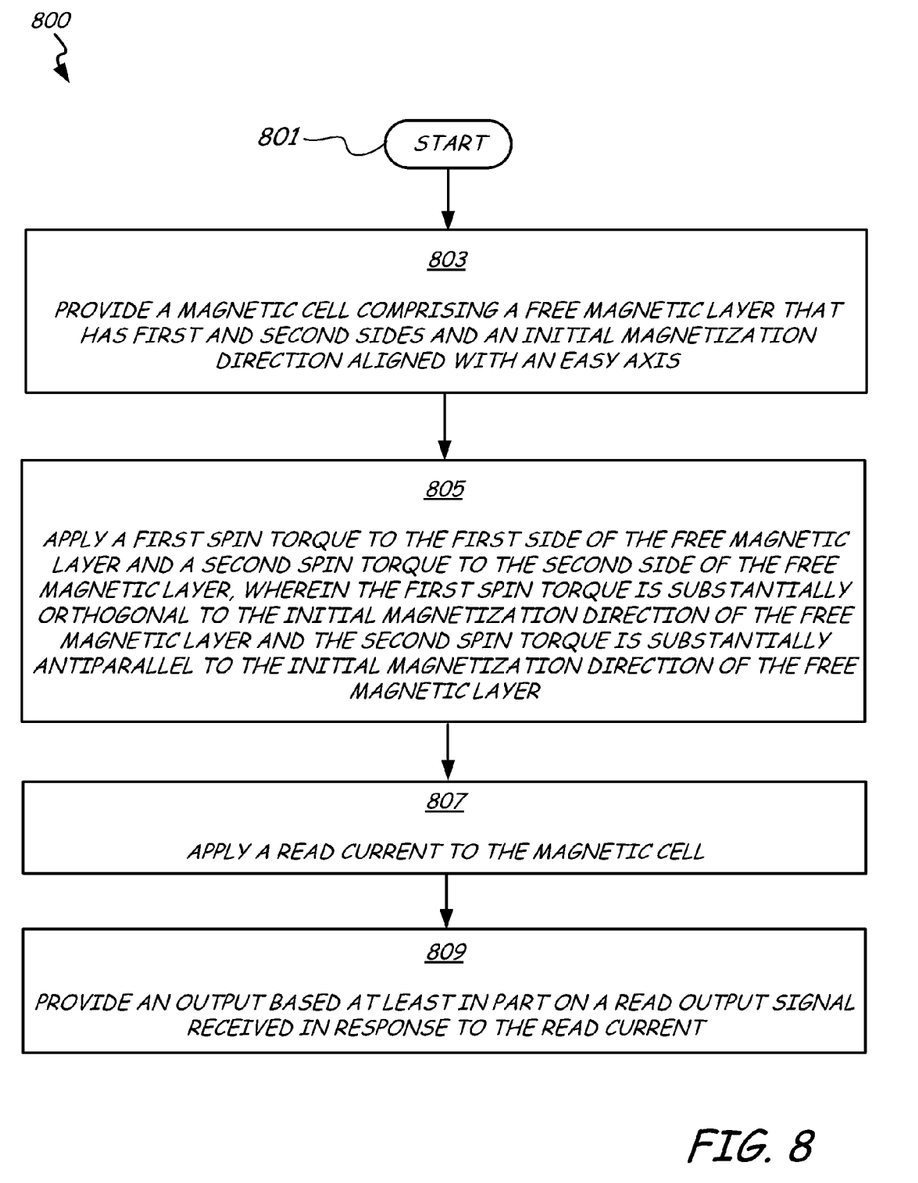
FIG. 8 depicts a method associated with a magnetic data storage cell, in accordance with an illustrative example.

FIG. 8 depicts a method 800 associated with one of the magnetic cells discussed above, of using a magnetic cell to write and read data, in accordance with an illustrative example. After starting 801, method 800 includes step 803, of providing a free magnetic layer, having first and second sides, the free magnetic layer having an initial magnetization direction aligned with an easy axis; and step 805, of applying a first spin torque at the first side to the free magnetic layer and a second spin torque to the second side of the free magnetic layer, wherein the first spin torque is substantially orthogonal to the initial magnetization direction of the free magnetic layer and the second spin torque is substantially antiparallel to the initial magnetization direction of the free magnetic layer. This may serve as a method for writing data to the magnetic cell. Method 800 may also include a read process, including step 807, of applying a read current to the free magnetic layer; and step 809, of providing an output based at least in part on a read output signal received in response to the read current. Any kind of data or information may thereby be stored in dual-reference-layer magnetic cells, and the data or information may be retrieved by a read process and used to provide a useful or informative form of tangible output, which may include a display rendered on a monitor, information printed out with a printer, audio data provided to a speaker, a tactile output, or data provided over a hard-wire or wireless signal connection to another computing system, device, router, node, etc. and which may at some point in time be available for incorporation in a user-perceptible output format.

It is to be understood that even though numerous characteristics and advantages of various aspects of the present disclosure have been set forth in the foregoing description, together with details of the structure and function of various configurations of the disclosure, this disclosure is illustrative only, and changes may be made in details, including in matters of structure and arrangement of parts within the principles of the present disclosure to the full extent indicated by the broad general meaning of the terms in which the appended claims are expressed.

For example, while magnetic layers and magnetic elements are depicted in the figures in a cylindrical form and of identical outer radius, various layers may be used that are of varying radii relative to each other, and of varying morphologies, particularly of morphologies that may be more efficient or may be inherent for the underlying crystal lattices of the materials used, particularly as storage cell size becomes ever smaller in subsequent iterations of development. As another example, while the examples discussed above make particular mention of cylindrically, one-dimensionally stacked magnetic layers with either perpendicularly or diametrically oriented magnetizations, other magnetic cells may be used in which various layers are stacked or arranged adjacent to each other in any arrangement, in multiple dimensions, and in which layers are used that may also be fixed in perpendicularly or diametrically oriented magnetizations or in an angular or "vortex" orientation of its magnetization, in which the magnetization direction curves circularly around the central vertical axis of the layer.

Various embodiments may also use layers in which their magnetization directions or easy axis are bi-stable in any two orientations; or are tri-stable in all three of the orientations mentioned above, including out-of-plane and two orthogonal in-plane orientations; or that are bi-stable or otherwise quasi-stable in diametrical orientations along two or more diametrically oriented axes of the layer. Various embodiments may also use other techniques and structures for defining the stable or quasi-stable orientations of the magnetization direction or easy axis of any of the magnetic layers, such as inner cavities defining inner annular radii of the layers, for example.

As yet another example, while the embodiments discussed above are discussed in the context of a magnetic cell with a single magnetic free layer, other embodiments may include a magnetic cell with multiple discrete magnetic free layers, in which a write operation can vary the current and duration of time the current is applied to a cell, in addition to the direction of the current, to controllably switch the magnetic free layers in any combination, thereby writing multiple bits of information to each single magnetic cell, according to an illustrative embodiment. The free magnetic layers may have interlayers separating each adjacent pair of free magnetic layers, in an illustrative embodiment, which may define discrete domain walls between adjacent free magnetic layers with opposing magnetization directions. Free magnetic layers that have their magnetization directions parallel to the primary, parallel-axis fixed layer may contribute to the spin torque of that parallel-axis fixed layer in switching free layers further down the stack of the magnetic cell, in an illustrative embodiment. Magnetic cells with multiple free magnetic layers may provide for relatively larger cells but with more bits stored per cell, and may thereby provide higher overall data storage density, in this illustrative embodiment.

As yet another example, a data storage cell or data storage system of the present disclosure may be used in association with any technology for the storage and/or manipulation of data, including those involving magnetoresistance, giant magnetoresistance, colossal magnetoresistance, flash memory, optics, magneto-optics, photonics, spintronics, holography, and any other technology. Various embodiments may also be incorporated in multi-technology devices that store or otherwise manipulate data with different components using magnetic cells as well as other technologies, such as disc drives or flash drives, for storing or manipulating different portions of data. In addition, the present disclosure is not limited to systems for storage or manipulation of data, but may also involve any technology involved with spin torque magnetic manipulation.

What is claimed is:

1. A magnetic cell comprising:
   a first fixed magnetic layer;
   a second fixed magnetic layer;
   a free magnetic layer positioned between the first and second fixed magnetic layers;
   terminals configured for providing spin-polarized current through the magnetic layers;
   a tunneling magnetoresistance interlayer disposed between the first fixed magnetic layer and the free magnetic layer; and
   a giant magnetoresistance interlayer between the second fixed magnetic layer and the free magnetic layer;
   wherein, a magnetization direction of the first fixed magnetic layer is substantially parallel to an easy axis of the free magnetic layer, and the second fixed magnetic layer has a magnetization direction that is substantially orthogonal to the easy axis of the free magnetic layer.

2. The magnetic cell of claim 1, further comprising a non-magnetic and electrically insulating interlayer between the first fixed magnetic layer and the free magnetic layer.

3. The magnetic cell of claim 1, further comprising a non-magnetic and electrically insulating interlayer between the first fixed magnetic layer and the free magnetic layer, and a non-magnetic and electrically conducting interlayer between the second fixed magnetic layer and the free magnetic layer.

4. The magnetic cell of claim 1, wherein the magnetic cell is configured to apply a first spin torque to a first side of the free magnetic layer and a second spin torque to a second side of the free magnetic layer, wherein the first spin torque is substantially orthogonal to the initial magnetization direction of the free magnetic layer and the second spin torque is substantially antiparallel to the initial magnetization direction of the free magnetic layer.

5. The magnetic cell of claim 1, wherein the magnetic cell is a spin torque random access memory cell.

6. The magnetic cell of claim 1, wherein the magnetization direction of the first fixed magnetic layer is an in-plane orientation and the magnetization direction of the second fixed magnetic layer is an out-of-plane orientation.

7. The magnetic cell of claim 1, wherein the magnetization direction of the second fixed magnetic layer is an in-plane orientation and the magnetization direction of the first fixed magnetic layer is an out-of-plane orientation.

8. The magnetic cell of claim 1, wherein the first and second fixed magnetic layers each have a greater magnetic volume than the free magnetic layer.

9. A magnetic cell comprising:
   a first fixed magnetic layer;
   a second fixed magnetic layer;
   a free magnetic layer positioned between the first and second fixed magnetic layers; and
   terminals configured for providing spin-polarized current through the magnetic layers;
   wherein, a magnetization direction of the first fixed magnetic layer is oriented in the first in-plane diametrical orientation, and the magnetization direction of the second fixed magnetic layer and the easy axis of the free magnetic layer are oriented in the second in-plane diametrical orientation, the first in-plane diametrical orientation being substantially orthogonal to the second in-plane diametrical orientation.

10. The magnetic cell of claim 9, further comprising a non-magnetic and electrically insulating interlayer between the first fixed magnetic layer and the free magnetic layer, and a non-magnetic and electrically conducting interlayer between the second fixed magnetic layer and the free magnetic layer.

11. The magnetic cell of claim 9, further comprising a tunneling magnetoresistance interlayer disposed between the first fixed magnetic layer and the free magnetic layer, and a giant magnetoresistance interlayer between the second fixed magnetic layer and the free magnetic layer.

12. The magnetic cell of claim 9, wherein the magnetic cell is configured to apply a first spin torque to a first side of the free magnetic layer and a second spin torque to a second side of the free magnetic layer, wherein the first spin torque is substantially orthogonal to the initial magnetization direction of the free magnetic layer and the second spin torque is substantially antiparallel to the initial magnetization direction of the free magnetic layer.

13. The magnetic cell of claim 9, wherein the magnetic cell is a spin torque random access memory cell.

14. The magnetic cell of claim 9, wherein the first and second fixed magnetic layers each have a greater magnetic volume than the free magnetic layer.

15. A spin torque random access memory array comprising:
   a plurality of spin torque memory cells configured in an array wherein at least selected spin torque memory cells comprise:
   a first fixed magnetic layer;
   a second fixed magnetic layer; and
   a free magnetic layer positioned between the first and second fixed magnetic layers;
   wherein, a magnetization direction of the first fixed magnetic layer is substantially parallel to an easy axis of the free magnetic layer , and the second fixed magnetic layer has a magnetization direction that is substantially orthogonal to the easy axis of the free magnetic layer.

16. A spin torque random access memory array of claim 15, further comprising a non-magnetic and electrically insulating interlayer between the first fixed magnetic layer and the free magnetic layer, and a non-magnetic and electrically conducting interlayer between the second fixed magnetic layer and the free magnetic layer.

17. A spin torque random access memory array of claim 15, further comprising a tunneling magnetoresistance interlayer disposed between the first fixed magnetic layer and the free magnetic layer, and a giant magnetoresistance interlayer between the second fixed magnetic layer and the free magnetic layer.

18. A spin torque random access memory array of claim 15, wherein the magnetic cell is configured to apply a first spin torque to a first side of the free magnetic layer and a second spin torque to a second side of the free magnetic layer, wherein the first spin torque is substantially orthogonal to the initial magnetization direction of the free magnetic layer and the second spin torque is substantially antiparallel to the initial magnetization direction of the free magnetic layer.

19. A spin torque random access memory array of claim 15, wherein the magnetization direction of the first fixed magnetic layer is an in-plane orientation and the magnetization direction of the second fixed magnetic layer is an out-of-plane orientation.

\* \* \* \* \*